(12) United States Patent
Liu et al.

(10) Patent No.: US 6,903,011 B2
(45) Date of Patent: Jun. 7, 2005

(54) DISPLACEMENT METHOD TO GROW CU OVERBURDEN

(75) Inventors: Chi-Wen Liu, Hsin-Chu (TW); Ying-Lang Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 6 days.

(21) Appl. No.: 10/455,650

(22) Filed: Jun. 5, 2003

(65) Prior Publication Data

US 2004/0248407 A1 Dec. 9, 2004

(51) Int. Cl.[7] .......................................... H01L 21/4763
(52) U.S. Cl. ...................... 438/642; 438/625; 438/633; 438/637
(58) Field of Search ................. 438/626, 625, 438/633, 637, 642

(56) References Cited

U.S. PATENT DOCUMENTS

| | | | | |
|---|---|---|---|---|
| 5,034,341 A | * | 7/1991 | Itoh | 438/242 |
| 5,824,580 A | * | 10/1998 | Hauf et al. | 438/243 |
| 5,891,513 A | | 4/1999 | Dubin et al. | |
| 6,069,049 A | * | 5/2000 | Geiss et al. | 438/386 |
| 6,080,646 A | * | 6/2000 | Wang | 438/585 |
| 6,147,378 A | * | 11/2000 | Liu et al. | 257/316 |
| 6,181,013 B1 | | 1/2001 | Liu et al. | |
| 6,235,625 B1 | | 5/2001 | Lou | |
| 6,251,734 B1 | * | 6/2001 | Grivna et al. | 438/296 |
| 6,251,774 B1 | * | 6/2001 | Harada et al. | 438/637 |
| 6,261,953 B1 | * | 7/2001 | Uozumi | 438/687 |
| 6,297,558 B1 | * | 10/2001 | Berman | 257/774 |
| 6,368,953 B1 | * | 4/2002 | Petrarca et al. | 438/625 |
| 2003/0068582 A1 | * | 4/2003 | Komada et al. | 430/317 |
| 2003/0100178 A1 | * | 5/2003 | Kamoshima et al. | 438/637 |
| 2003/0214010 A1 | * | 11/2003 | Toyoda et al. | 257/499 |

OTHER PUBLICATIONS

Wolf and Taber, et al., "Silicon Processing for the VLSI Era, vol. 1: Process Technology," 2nd Edition, 2000, p. 483 and pp. 778–780, Lattice Press, Sunset Beach, CA.

* cited by examiner

Primary Examiner—Matthew Smith
Assistant Examiner—Chuong Anh Luu
(74) Attorney, Agent, or Firm—Slater & Matsil, L.L.P.

(57) ABSTRACT

A damascene-formed conductive region having a recess formed at the top surface thereof by a chemical-mechanical polish (CMP) process is repaired or regrown using a displacement method. A displacement material is deposited over the recessed conductive material. The displacement material is removed from a top surface of the insulating layer surrounding the damascene conductive region, and the semiconductor device is placed in a solution. The displacement material reacts with the solution, and copper in the solution is grown as a result of the displacement over the recess of the conductive region. The displacement method results in reducing or eliminating the recess formed by the CMP process.

23 Claims, 1 Drawing Sheet

100

100

200

200

DISPLACEMENT METHOD TO GROW CU OVERBURDEN

TECHNICAL FIELD

The present invention relates generally to the fabrication of semiconductor devices, and more particularly to the fabrication of conductive lines of semiconductor devices using a damascene process.

BACKGROUND

Semiconductor devices are used in many electronic applications, such as radios, televisions, cell phones and computers, as examples. Semiconductor devices are often fabricated as integrated circuits, with hundreds or thousands devices often being manufactured on a single chip.

Semiconductor devices are typically manufactured by depositing several insulating, conducting, and semiconductor layers over a workpiece, and patterning each layer to form conductive lines and electrical circuit elements therein. Metallization layers are usually used for the interconnect layers of semiconductor devices. In multi-level metallization schemes, these metallization layers have insulating layers or inter-level dielectric layers (ILD) disposed between each metallization layer, with vias formed within the ILD layer that provide vertical electrical connection for the semiconductor device.

For many years, aluminum was the preferred choice of material for interconnect layers of semiconductor devices. Aluminum is advantageous in that it may be patterned in a subtractive etch process, e.g., a layer of aluminum is deposited, photoresist is deposited over the aluminum layer, the photoresist is patterned, and then the photoresist is used as a mask while exposed portions of the aluminum are removed in a subtractive etch process.

However, to improve device function and efficiency, copper is being used more and more as a material for interconnections because of its low resistivity, high melting point, and superior electromigration endurance. Copper is also advantageous as an interconnect material because of its stress-void resistance improvement over aluminum. However, copper is difficult to etch in a subtractive process; therefore, copper is usually patterned using damascene processes.

FIG. 1 illustrates a cross-sectional view of a semiconductor device 100 in which conductive lines will be formed in a damascene process, and will be described herein in accordance with a prior art process. A workpiece 110 which may comprise a silicon substrate, for example, is provided. An insulating layer 112 is deposited or formed over the workpiece 110. The insulating layer 112 is patterned, for example, using traditional photolithography techniques and a photoresist. The pattern formed in the insulating layer 112 comprises the pattern for conductive lines that will be formed. A liner 114 may be deposited over the insulating layer 112, particularly if the conductive lines comprise copper, for example. A conductive material 116, which may comprise copper, for example, is deposited over the liner 114, as shown. The conductive material 116 has a top surface that is relatively conformal to the underlying topography of the insulating layer 1112. For example, the conductive material 116 may have a recess formed over the top of the trench in the insulating layer 112 for the conductive lines.

To form conductive lines in the insulating layer 112, the insulating layer 112 is planarized, for example, using a chemical-mechanical polish (CMP) process to remove the conductive material 116 and the liner 114 from the top surface of the insulating layer 112, as shown in FIG. 2. A disadvantage of using a CMP process to remove excess conductive material 116 and liner 114 from the top surface of the insulating layer 112 is that the copper material 116 dishes or forms a recess 118 below the top surface of the insulating layer 112, as shown. The erosion, recess or dishing 118 is undesirable because the conducting area of the conductive material 116 is reduced and the sheet resistance of the conductive material 116 is increased.

What is needed in the art is a method of forming copper damascene conductive lines that has reduced dishing and/or no dishing at all of the copper conductive lines.

SUMMARY OF THE INVENTION

These and other problems are generally solved or circumvented, and technical advantages are generally achieved, by preferred embodiments of the present invention, which provide a method of increasing copper material in a recessed area after a copper CMP step. A displacement method is used to grow a copper overburden, which decreases or eliminates the copper CMP dishing. A displacement material is deposited over the recessed copper conductive lines and the workpiece is placed in a copper and fluorine containing solution. The displacement material reacts with the fluorine in the solution, and copper from the solution is deposited over the recessed conductive line, filling in the recess at least partially, repairing the recess and growing a copper overburden.

In accordance with a preferred embodiment of the present invention, a method of forming conductive regions of a semiconductor device includes providing a workpiece, the workpiece having an insulating layer disposed thereon, the insulating layer being patterned with a pattern for at least one conductive region and having a top surface, and filling the patterned insulating layer with a conductive material. The workpiece is planarized to remove the conductive material from over the top surface of the insulating layer, leaving the conductive material recessed beneath the top surface of the insulating layer, a displacement material is deposited over the recessed conductive material and exposed portions of the insulating layer, and the workpiece is planarized to remove the displacement material from over the top surface of the insulating layer. The displacement material is reacted with a solution containing the conductive material to remove the displacement material from over the recessed conductive material and fill the conductive material recess at least partially with conductive material from the solution.

In accordance with another preferred embodiment of the present invention, a method of growing copper over chemically-mechanically polished recessed copper conductive lines of a semiconductor device includes providing a workpiece, disposing an insulating layer over the workpiece, the insulating layer having a top surface, and patterning the insulating layer with a pattern for at least one conductive region. The method includes forming a layer of copper over the insulating layer to fill the patterned insulating layer with copper, planarizing the workpiece to remove the copper from the top surface of the insulating layer, leaving the copper recessed beneath the top surface of the insulating layer, and depositing a displacement material over the recessed copper and exposed portions of the insulating layer. The method further includes planarizing the workpiece to remove the displacement material from over the top surface of the insulating layer, and exposing the workpiece to a solution containing copper and fluorine, removing the displacement material from over the recessed copper and filling the copper recess at least partially with copper from the solution.

In accordance with yet another preferred embodiment of the present invention, a method of repairing a recessed chemically-mechanically polished damascene conductive region of a semiconductor device includes providing a workpiece, the workpiece having a patterned insulating layer disposed thereon and a chemically-mechanically polished conductive material having a recessed top surface residing in the patterned insulating layer. The method includes depositing a displacement material over the recessed conductive material and exposed portions of the insulating layer, planarizing the workpiece to remove the displacement material from over the top surface of the insulating layer, and reacting the displacement material with a solution containing the conductive material to remove the displacement material from over the recessed conductive material and fill the conductive material recess at least partially with conductive material from the solution.

Embodiments of the present invention achieve technical advantages as a method of decreasing or eliminating the recess that is created during a CMP process of damascene conductive lines, repairing the damaged conductive lines and resulting in an increased conductive area of the copper conductive line and decreased sheet resistance.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which:

FIGS. 3 through 6a show cross-sectional views of a semiconductor device in accordance with an embodiment of the invention, in which a displacement material is deposited over recessed damascene-formed conductive lines, and the workpiece is submerged in a solution in order to grow a copper overburden and reduce the dishing of the conductive line top surface.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, a damascene process for forming copper conductive lines or regions. The invention may also be applied, however, to other damascene processes for forming other conductive regions and materials, and also to multiple-damascene processes such as a dual-damascene process, for example, where the underlying insulating layer is patterned using more than one mask.

Figure 1:
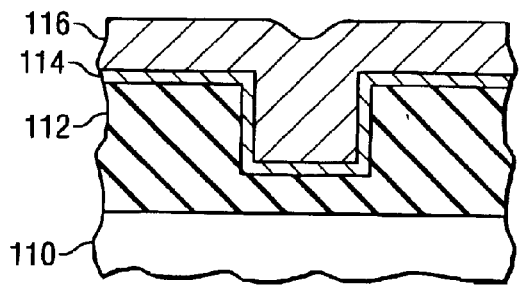
FIGS. 1 and 2 illustrate cross-sectional views of a prior art method of forming conductive lines in a damascene process, which results in dishing or recessing of the conductive line top surface.
Figure 2:
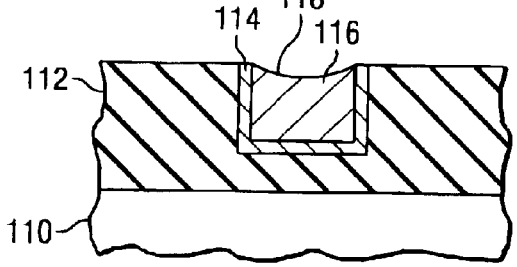
Figure 3:
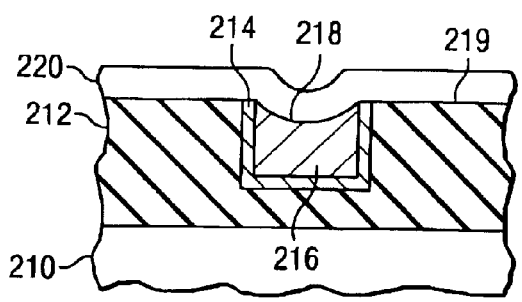

With reference now to FIG. 3, a semiconductor device 200 comprises a workpiece 210. The workpiece 210 typically comprises silicon oxide over a single crystal silicon wafer. The workpiece 210 may include other conductive layers or other semiconductor elements, e.g., transistors, diodes, etc. Compound semiconductors such as GaAs, InP, Si/Ge, SiC, for example, may be used in place of silicon.

An insulating layer 212 is deposited over the workpiece 210, as shown in FIG. 3. The insulating layer 212 may comprise an ILD layer, for example, and typically comprises silicon dioxide or other insulating materials. Alternatively, the insulating layer 212 may comprise low-k dielectric materials or high-k dielectric materials, for example. If the conductive lines will comprise copper, often a low-k dielectric material will be used to reduce the R-C time delay of the device, for example.

Using a damascene process, the insulating layer 212 is patterned and etched to form at least one trench in which conductive lines or regions will later be formed. The at least one trench may comprise a long thin line that is straight, or may comprise square or circular shapes, as examples. The trenches may have 90-degree turns and may be coupled to vias or other circuit elements that are formed in previously formed insulating layers, not shown.

A liner 214 may be deposited over the insulating layer 212. The liner 214 may comprise a barrier layer of TaN, Ta or Ti, or combinations thereof, deposited by physical vapor deposition (PVD), in a thickness of 100 to 200 Angstroms, as examples. The barrier layer of the liner 214 may alternatively comprise other materials and thicknesses, deposited by other methods, for example. The liner 214 may also comprise a seed layer disposed over the barrier layer, comprising sputtered copper, as an example.

Next, a layer of conductive material 216, preferably comprising copper or a copper alloy, and alternatively comprising other metals, is deposited over the liner 214 to fill the trenches. The conductive material 216 may be deposited by sputtering, electrolysis copper plating (ECP), or electroless copper plating, as examples. After being deposited, the conductive material 216 typically covers the entire top surface 219 of the insulating layer 212.

A CMP process is performed on the wafer 210 to remove the conductive material 216 and the liner 214 from the top surface 219 of the insulating layer 212. As a result of the CMP process, during the CMP process, the conductive material 216 is removed not only from the top surface 219 of the insulating layer 212, but the conductive material is also removed below the top surface of insulating layer 212 by a recessed amount, creating dishing or recessing 218. The height of the recess 218 may be 10 to 100 nanometers lower than the top surface 219 of the insulating layer, for example. The conductive line 214/216 comprises the liner 214 and the conductive material 216.

In accordance with embodiments of the present invention, next, a displacement material 220 is deposited over insulating layer 212 and conductive lines 214/216, as shown in FIG. 3. The displacement material 220 preferably comprises Si, Ti or Ta, as examples, although alternatively, the displacement material 220 may comprise other materials. The displacement material 220 may be deposited by PVD, e.g. sputtering, or chemical vapor deposition (CVD), as examples. The thickness of the displacement material 220 deposited preferably ranges from approximately 10 to 1500 Angstroms, and more preferably, ranges from 500 to 1500 Angstroms, as examples.

Figure 4:
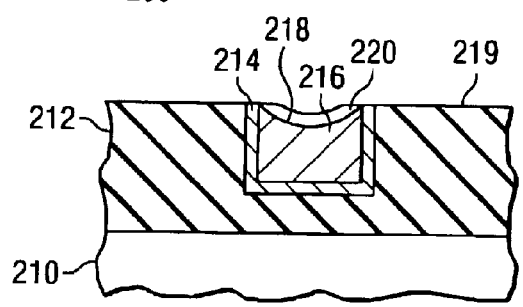

The displacement material 220 is planarized, e.g., with a CMP process to remove portions of the displacement material 220 from the top of the insulating layer 212, as shown in FIG. 4. After the CMP process, a portion of the displacement material 220 remains on top of the conductive lines 214/216 within the recess 218. After the CMP process, the displacement material 220 is recessed slightly below the top surface 219 of the insulating material 212.

Figure 5:
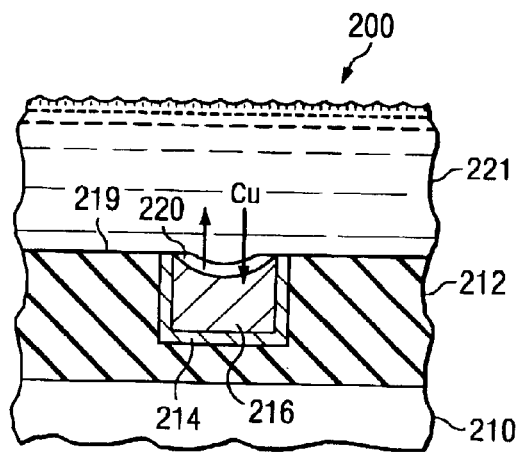

Next, referring to FIG. 5, the workpiece 210 is placed in, e.g., submerged in a solution 221. The solution 221 preferably comprises both copper and fluorine, for example. In one embodiment, for example, the solution 221 preferably comprises fluorine (F) in a F-complex such as HF, which is dissolved in water. The copper is an ion that is dissolved in the solution 221.

The displacement material 220 reacts with the solution 221 to form a reactant that is distributed uniformly in the solution 221. The copper in the solution 221 displaces the displacement material 220, as the displacement material 220 reacts with the solution 221. Therefore, in accordance with the embodiments of the present invention, copper is grown in the recessed surface 218 of the conductive line 216 in a displacement. For example, if silicon (Si) is used for the displacement material 220, the chemical reaction that occurs is:

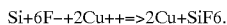

Si+6F−+2Cu++=>2Cu+SiF6.

In another embodiment, the displacement material 220 comprises tantalum (Ta). In this embodiment, the chemical reaction that occurs is:

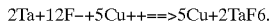

2Ta+12F−+5Cu++==>5Cu+2TaF6.

In another embodiment of the present invention, the displacement material 220 comprises titanium (Ti). In this embodiment, the chemical reaction that occurs is the following:

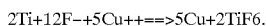

2Ti+12F−+5Cu++==>5Cu+2TiF6.

Figure 6A:
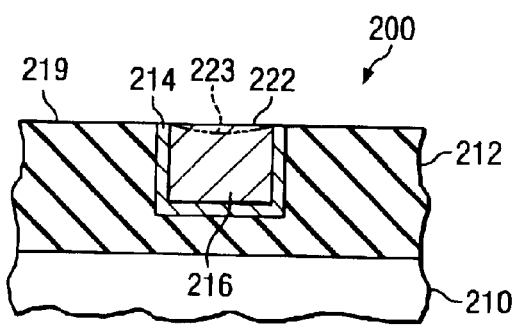

A cross-sectional view of the semiconductor device 200 after reacting the displacement material 220 with the solution 221 is shown in FIG. 6a. In one embodiment, after the reaction with the solution 221 (not shown in FIG. 6a, see FIG. 5), the conductive material 216 recess has been filled in completely, as shown at 222. Alternatively, in another embodiment, the conductive material 216 may be partially grown such that the recess 223 has a height greater than the height of the recess 218 shown in FIG. 3. In yet another embodiment shown in FIG. 6b, the conductive material 224 is slightly overgrown so that the height 224 of the top surface of the conductive material 216 is greater than the height of the top surface 219 of the insulating layer 212.

Figure 6B:
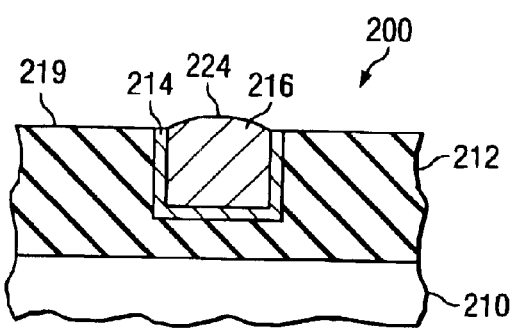
FIG. 6b illustrates an alternative embodiment of the present invention, in which the copper overburden grown has a height exceeding the top surface of the insulating layer.

Embodiments of the present invention achieve technical advantages by repairing or growing the recess 218 that is formed in a CMP process for copper conductive lines 214/216. The dishing 218 that is formed during the copper CMP process may be reduced (the term "reduced" used herein with reference to the recess refers to filling in or re-growing the recess), as shown in FIG. 6a at 223. Alternatively, the recess may be completely eliminated, as shown in FIG. 6a at 222, or may be overgrown, as shown in FIG. 6b at 224. A smooth overburdened copper surface 222, 223, and 224 is formed on the conductive material 216, which reduces the sheet resistance and improves the performance of the semiconductor device. Semiconductor devices utilizing embodiments of the present invention benefit from increased signal speed, decreased heat generated when current is run through the conductive lines 216, and reduced power consumption.

Embodiments of the present invention have been described herein with reference to copper as the conductive material 216. However, embodiments of the present invention are beneficial in forming conductive lines from any conductive material that suffers from recessing during the CMP process from a damascene process.

Furthermore, although the conductive structure 214/216 has been described herein as a conductive line, alternatively, the conductive region 214/216 may comprise a contact pad or other contact region of a semiconductor device 200.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming conductive regions of a semiconductor device, the method comprising:
providing a workpiece, the workpiece having an insulating layer disposed thereon, the insulating layer being patterned with a pattern for at least one conductive region and having a top surface;
filling the patterned insulating layer with a conductive material;
planarizing the workpiece to remove the conductive material from over the top surface of the insulating layer, leaving the conductive material recessed beneath the top surface of the insulating layer;

depositing a displacement material over the recessed conductive material and exposed portions of the insulating layer;

planarizing the workpiece to remove the displacement material from over the top surface of the insulating layer; and reacting the displacement material with a solution containing the conductive material to remove the displacement material from over the recessed conductive material and fill the conductive material recess at least partially with conductive material from the solution.

2. The method according to claim 1, wherein depositing the displacement material comprises depositing Si, Ti or Ta.

3. The method according to claim 2, wherein depositing the displacement material comprises depositing 10 to 1500 Angstroms of the displacement material.

4. The method according to claim 1, wherein after planarizing the workpiece to remove the conductive material from over the top surface of the insulating layer, the conductive material is recessed approximately 2000 Angstroms or less from beneath the top surface of the insulating layer.

5. The method according to claim 1, wherein reacting the displacement material with the solution comprises reacting the displacement material with a solution containing fluorine.

6. The method according to claim 1, wherein reacting the displacement material with the solution containing the conductive material completely fills the conductive material recess with conductive material from the solution.

7. The method according to claim 1, wherein reacting the displacement material with the solution containing the conductive material overfills the conductive material recess with conductive material from the solution so that a top surface of the conductive material has a height greater than the insulating layer top surface.

8. The method according to claim 1, wherein the at least one conductive region comprises at least one conductive line.

9. The method according to claim 1, wherein planarizing the workpiece comprises using a chemical-mechanical polish process.

10. The method according to claim 1, wherein filling the patterned insulating layer comprises depositing copper over the insulating layer, wherein the solution comprises copper.

11. The method according to claim 10, further comprising, before filling the patterned insulating layer with the conductive material, forming a liner over the patterned insulating layer, and forming a seed layer over the liner.

12. A method of growing copper over chemically-mechanically polished recessed copper conductive lines of a semiconductor device, the method comprising:

providing a workpiece;

disposing an insulating layer over the workpiece, the insulating layer having a top surface;

patterning the insulating layer with a pattern for at least one conductive region;

forming a layer of copper over the insulating layer to fill the patterned insulating layer with copper;

planarizing the workpiece to remove the copper from the top surface of the insulating layer, leaving the copper recessed beneath the top surface of the insulating layer;

depositing a displacement material over the recessed copper and exposed portions of the insulating layer;

planarizing the workpiece to remove the displacement material from over the top surface of the insulating layer; and exposing the workpiece to a solution containing copper and fluorine, removing the displacement material from over the recessed copper and filling the copper recess at least partially with copper from the solution.

13. The method according to claim 12, wherein depositing the displacement material comprises depositing Si, Ti or Ta.

14. The method according to claim 13, wherein depositing the displacement material comprises depositing 10 to 1500 Angstroms of the displacement material.

15. The method according to claim 12, wherein after planarizing the workpiece to remove the copper material from over the top surface of the insulating layer, the copper is recessed approximately 2000 Angstroms or less from beneath the top surface of the insulating layer.

16. The method according to claim 12, wherein reacting the displacement material with the solution containing the copper completely fills the copper recess with copper from the solution.

17. The method according to claim 12, wherein reacting the displacement material with the solution containing the copper overfills the copper recess with copper from the solution so that a top surface of the copper has a height greater than the insulating layer top surface.

18. The method according to claim 12, wherein the at least one conductive region comprises at least one conductive line.

19. The method according to claim 12, wherein planarizing the workpiece comprises using a chemical-mechanical polish process.

20. The method according to claim 12, further comprising, before filling the patterned insulating layer with copper, forming a liner over the patterned insulating layer, and forming a seed layer over the liner.

21. A method of repairing a recessed chemically-mechanically polished damascene conductive region of a semiconductor device, the method comprising:

providing a workpiece, the workpiece having a patterned insulating layer disposed thereon and a chemically-mechanically polished conductive material having a recessed top surface residing in the patterned insulating layer;

depositing a displacement material over the recessed conductive material and exposed portions of the insulating layer;

planarizing the workpiece to remove the displacement material from over the top surface of the insulating layer; and reacting the displacement material with a solution containing the conductive material to remove the displacement material from over the recessed conductive material and fill the conductive material recess at least partially with conductive material from the solution.

22. The method according to claim 21, wherein depositing a displacement material comprises depositing Si, Ti or Ta in a thickness of 10 to 1500 Angstroms.

23. The method according to claim 21, wherein the conductive material comprises copper.

* * * * *